US009912084B2

United States Patent
Costello

(10) Patent No.: US 9,912,084 B2
(45) Date of Patent: Mar. 6, 2018

(54) HIGH SPEED SIGNAL CONNECTOR ASSEMBLY

(71) Applicant: Tyco Electronics Corporation, Berwyn, PA (US)

(72) Inventor: Brian Patrick Costello, Scotts Valley, CA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 339 days.

(21) Appl. No.: 14/463,716

(22) Filed: Aug. 20, 2014

(65) Prior Publication Data

US 2016/0056554 A1 Feb. 25, 2016

(51) Int. Cl.
| | |
|---|---|
| *H01R 12/70* | (2011.01) |
| *H01R 12/75* | (2011.01) |
| *H01R 12/71* | (2011.01) |
| *H01R 12/73* | (2011.01) |
| *G06F 1/18* | (2006.01) |
| *H05K 7/14* | (2006.01) |

(52) U.S. Cl.
CPC ........... *H01R 12/7076* (2013.01); *G06F 1/18* (2013.01); *H01R 12/712* (2013.01); *H01R 12/73* (2013.01); *H01R 12/75* (2013.01); *H05K 7/1487* (2013.01)

(58) Field of Classification Search
CPC ..................................................... H01R 12/59
USPC .................................. 439/67, 77, 493, 329
See application file for complete search history.

(56) References Cited

U.S. PATENT DOCUMENTS

| | | | | | |
|---|---|---|---|---|---|
| 3,356,983 | A | * | 12/1967 | Johnson, Jr. ........... | H01R 12/62 439/296 |
| 4,871,315 | A | * | 10/1989 | Noschese ............... | H01R 12/79 439/329 |
| 4,948,379 | A | * | 8/1990 | Evans .................... | H01R 12/79 439/329 |
| 5,199,896 | A | * | 4/1993 | Mosquera ............ | H01R 12/714 29/842 |
| 5,219,293 | A | * | 6/1993 | Imamura ................ | H01R 12/62 439/493 |
| 5,261,826 | A | * | 11/1993 | Leeb ...................... | H01R 12/62 333/246 |
| 5,383,787 | A | * | 1/1995 | Switky ................... | H01L 23/32 439/67 |
| 5,716,226 | A | * | 2/1998 | Takahashi .......... | H01R 12/7058 439/329 |
| 6,053,746 | A | * | 4/2000 | Yoshizawa ............. | H01R 12/62 439/632 |
| 6,336,816 | B1 | * | 1/2002 | Yatskov ............... | H01R 12/721 439/493 |

(Continued)

*Primary Examiner* — Neil Abrams

(57) ABSTRACT

A connector assembly is configured to provide one or more signal paths between electrical components mounted on at least one component device. The connector assembly may include a printed circuit board (PCB) that supports one or more contacts on a first PCB surface that is opposite from a second PCB surface, a spacer secured over the first PCB surface, wherein at least portions of the one or more contacts are exposed through an opening in the spacer, and a support plate is secured to the second PCB surface. The support plate is configured to mount the connector assembly to a first device surface that is opposite from a second device surface on which at least one electrical component is mounted. The support plate may include fasteners at four corners.

22 Claims, 5 Drawing Sheets

(56) References Cited

U.S. PATENT DOCUMENTS

| | | | |
|---|---|---|---|
| 6,659,802 B1 * | 12/2003 | Lwee | H01R 12/62 439/630 |
| 6,846,115 B1 * | 1/2005 | Shang | H01R 12/7076 385/92 |
| 6,971,887 B1 * | 12/2005 | Trobough | H05K 7/1092 439/71 |
| 6,979,891 B2 * | 12/2005 | Wood | H01L 23/49805 257/679 |
| 7,046,020 B2 * | 5/2006 | LaMeres | G01R 1/07314 324/754.07 |
| 7,066,740 B2 | 6/2006 | Audet et al. | |
| 7,066,756 B2 * | 6/2006 | Lange | H01R 12/7017 439/289 |
| 7,407,408 B1 * | 8/2008 | Taylor | H01R 23/661 439/449 |
| 7,530,815 B2 * | 5/2009 | Ju | H05K 3/365 439/67 |
| 7,654,847 B2 * | 2/2010 | Soubh | G01R 1/06733 29/743 |
| 7,891,983 B2 | 2/2011 | Ichimura et al. | |
| 8,167,644 B2 | 5/2012 | Mason | |
| 8,172,615 B2 | 5/2012 | Mason | |
| 8,188,594 B2 * | 5/2012 | Ganesan | H01L 23/367 257/675 |
| 8,308,491 B2 * | 11/2012 | Nichols | H01R 12/73 439/67 |
| 8,382,487 B2 | 2/2013 | Jeon et al. | |
| 8,398,429 B2 * | 3/2013 | Costello | H04Q 1/025 439/505 |
| 8,708,729 B2 * | 4/2014 | An | H01R 12/79 439/331 |
| 8,721,348 B2 * | 5/2014 | Costello | H05K 7/1438 439/377 |
| 8,727,808 B2 | 5/2014 | Mason et al. | |
| 8,758,036 B2 * | 6/2014 | An | H01R 12/79 439/331 |
| 8,851,932 B2 | 10/2014 | Mason | |
| 8,867,231 B2 * | 10/2014 | Roitberg | H01L 23/50 361/729 |
| 8,932,083 B2 * | 1/2015 | Ho | H01R 12/613 439/660 |
| 9,225,115 B2 * | 12/2015 | Malek | H01R 12/7047 |
| 9,472,878 B2 * | 10/2016 | Costello | H01R 12/73 |
| 9,559,446 B1 * | 1/2017 | Wetzel | H01R 12/7088 |
| 9,590,338 B1 * | 3/2017 | Schmitt | H01R 12/79 |
| 2016/0056554 A1 * | 2/2016 | Costello | H01R 12/7076 439/65 |

* cited by examiner

HIGH SPEED SIGNAL CONNECTOR ASSEMBLY

BACKGROUND OF THE DISCLOSURE

Embodiments of the present disclosure generally relate to electrical connector assemblies.

Various communication or computing systems use electrical connectors to transmit data signals between different components of the systems. An electrical connector may electrically and mechanically connect one blade server to another blade server, for example. As data signal speeds continue to increase, signal integrity may diminish. In order to maintain signal integrity, some known connector assemblies are mounted on expensive dielectric printed circuit board materials. The use of such specialized dielectric printed circuit board materials, however, increases the cost of each printed circuit board assembly and the cost of the overall system.

Known computer blade server systems may include multiple processors on each blade or board. In order to be commercially viable, such systems include the latest, up-to-date processors. However, suitable high speed connections between the processors are often expensive.

One known computer blade system includes a high speed communication channel between central processing units (CPUs) on multiple server blades. As an example, each server blade may include two CPUs. Each CPU connects to another CPU through the high speed communication channel. However, using a backplane interface on a rear side of a server board or blade may not provide a suitable connection interface for the high speed signals. As such, the system may utilize higher quality board material that is able to accommodate the high speed signals. However, such material may be costly.

A need exists for a practical, lower cost system and method of connecting a server board or blade to another component.

BRIEF DESCRIPTION OF THE DISCLOSURE

Certain embodiments of the present disclosure provide a connector assembly configured to provide one or more signal paths between electrical components mounted on at least one component device, such as a system printed circuit board. The connector assembly may include a printed circuit board (PCB) that supports one or more contacts on a first PCB surface (such as an upper surface of the PCB) that is opposite from a second PCB surface (such as a bottom surface of a system PCB). A spacer may be secured over the first PCB surface. At least portions of the one or more contacts are exposed through the spacer. A support plate may be secured to the second PCB surface. The support is configured to assist in mounting the connector assembly to a first device surface (such as a bottom surface of the device) that is opposite from a second device surface (such as a top surface of the device) on which at least one electrical component is mounted.

The connector assembly may be separate and distinct from the component device. At least a portion of the PCB and at least a portion of the spacer may be configured to be sandwiched between the support plate and the first device surface.

In at least one embodiment, at least one electrical cable extends from the PCB. The electrical(s) cable connects to the contact(s). The electrical cable(s) may also connect to a cable receptacle connector.

In at least one embodiment, one or more backplane connectors may be mounted on the first PCB surface. The backplane connector(s) may connect to the contact(s).

Each contact may include a board-engaging stem connected to an intermediate beam. The board-engaging stem may be configured to be retained within a conductive via formed within the PCB. An upturned tip may be connected to the intermediate beam. An offset beam may extend from the intermediate beam. A canted contact beam may extend from the offset beam. Alternatively, various other contacts may be used, such as eye-of-the-needle contacts, plug and socket contacts, and the like.

Certain embodiments of the present disclosure provide a system that may include a first component device having a first device surface (such as a top surface of the device) and a second device surface (such as a bottom surface of the device) that is opposite from the first device surface. At least one electrical component is mounted on the first device surface, and one or more first device contacts extend from the second device surface and connect to the at least one electrical component. The system may also include a connector assembly that may include a printed circuit board (PCB) that supports one or more first connector contacts on a first PCB surface (such as a top surface of the PCB) that is opposite from a second PCB surface (such as a bottom surface of the PCB). The connector assembly may also include a spacer secured over the first PCB surface. At least portions of the one or more first connector contacts are exposed through the spacer. A support plate may be secured to the second PCB surface. The support plate mounts the connector assembly to the second device surface. The first connector contact(s) mate with the first device contact(s).

In at least one embodiment, the first component device includes a server board, and the at least one electrical component includes a first central processing unit (CPU). In at least one embodiment, a second CPU connects to one or more second device contacts extending from the second device surface. The connector assembly may include one or more second connector contacts on the first PCB surface. The second connector contact(s) mate with the second device contact(s).

In at least one embodiment, the system may include a second component device. The connector assembly connects the first component device to the second component device. For example, the second component device may be positioned over the first component device. In such an embodiment, a riser may connect the connector assembly to the second component device, such as through another connector assembly.

DETAILED DESCRIPTION OF THE DISCLOSURE

Embodiments of the present disclosure provide a practical, inexpensive system and method for connecting a component device, such as a server board or blade, to another component device. For example, embodiments of the present disclosure provide a connector assembly that may provide a signal path between a central processing unit (CPU) on a server board to another CPU, whether on the same board, another server board, or on or within another electrical component. Certain embodiments of the present disclosure provide a connector assembly that is configured to provide a high performance, high speed data connection in relation to a server board or blade. The connector assembly may be separate and distinct from the server board or blade. For example, the connector assembly may be mounted to a surface of the server board or blade that is opposite the surface on which a CPU is mounted.

Figure 1:
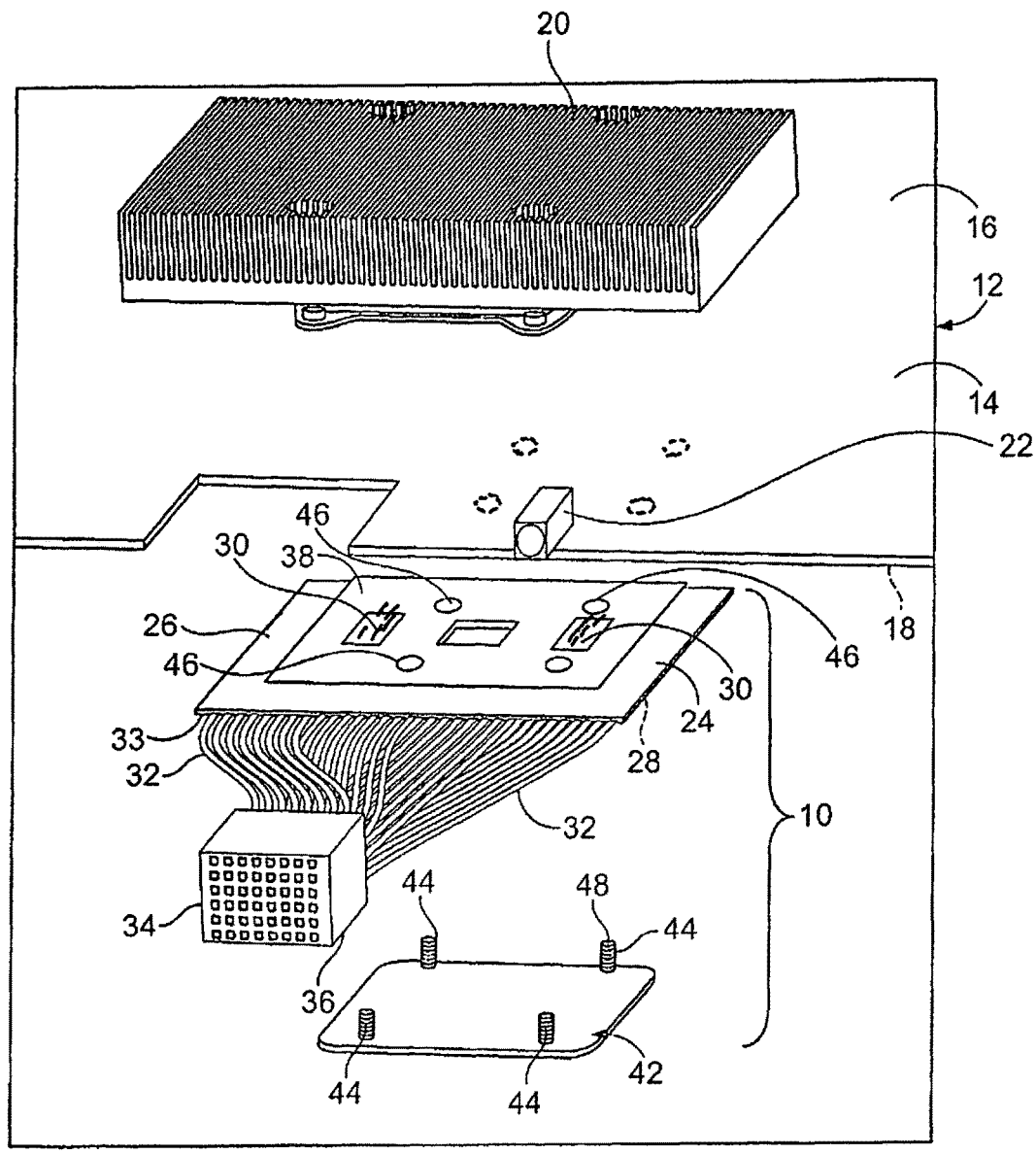
FIG. 1 illustrates a perspective top view of a high speed signal connector assembly aligned with a server board, according to an embodiment of the present disclosure.

FIG. 1 illustrates a perspective top view of a high speed signal connector assembly 10 aligned with a server board 12, according to an embodiment of the present disclosure. The server board 12 may include a main body 14 having a top surface 16 integrally connected to a bottom surface 18. In general, the server board 12 may be a planar board or blade that supports signal traces and various electrical components.

A heat sink 20 may be positioned over a CPU (hidden from view) that is supported on the top surface 16 of the main body 14. Signal traces may connect the CPU to contact pads (hidden from view) on the bottom surface 18 of the main body 14.

The top surface 16 is an example of a device surface that supports an electrical component, such as the CPU, for example. The bottom surface 18 is an example of a device surface that is opposite the device surface that supports the electrical component. It is to be understood that the terms "bottom" and "top" are merely used as examples with respect to the orientations shown in the Figures. However, the various embodiments shown may be inverted such that the bottom becomes top, and vice versa.

An alignment module 22 may also be connected to the top surface 16. The alignment module 22 may be configured to align and guide the server board 12 with a riser, for example, that connects the server board 12 to another server board or electrical component.

The high speed signal connector assembly 10 may include a printed circuit board (PCB) 24, such as a paddleboard, having a top surface 26 integrally connected to a bottom surface 28. A plurality of electrical contacts 30 (or "contacts" or "connector contacts") are supported on the top surface 26. The electrical contacts 30 connect to cables 32 that extend outwardly from a front edge 33 (from the top surface 26 or the bottom surface 28, for example) through signal traces (not shown).

The cables 32 may connect to a cable receptacle connector 34. The cable receptacle connector 34 includes a housing 36 that is configured to connect to another electrical component (not shown). For example, the housing 36 may mount to another server board, to another area on the server board 12, or to various other electrical devices that are configured to transmit and receive high speed data signals. Because the cables 32 are flexible, the cables 32 may be bent, curved, twisted, or otherwise routed to allow the cable receptacle connector 34 to be positioned at various positions relative to the server board 12.

A spacer 38 may be positioned over the PCB 24 and configured to space the PCB 24 from the bottom surface 18 of the server board 12. The spacer 38 may be a planar sheet of material, such as plastic, that includes internal openings that are configured to expose the electrical contacts 30. The spacer 38 ensures that the electrical contacts 30 are not overly compressed when the high speed signal connector assembly 10 is mated with the bottom surface 18 of the server board 12.

The high speed signal connector assembly 10 may also include a rigid support or backer plate 42. The support plate 42 may be formed of a rigid material, such as metal or plastic, and may include an insulating layer, for example. For example, the support plate 42 may include an insulating layer positioned between the top surface of the support plate and the bottom surface 28 of the PCB 24. Optionally, the insulating layer may encapsulate the metal or plastic. A plurality of fasteners 44, such as threaded bolts, may be secured within retention openings formed through the support plate 42. More or less fasteners 44 than shown may be used.

The support plate 42 is configured to support the PCB 24 and align the electrical contacts 30 with respect to reciprocal electrical contacts (or "reciprocal contacts" or "reciprocal device contacts") located on the bottom surface 18 of the server board 12. The length of the fasteners 44 may be configured to allow threaded portions to threadably engage reciprocal threaded securing openings formed in the server board 12, for example. As an example, each fastener 44 may include a threaded tip that may generally be at a height on the fastener 44 body that is similar to the depth of each securing opening formed in the server board 12. The remainder of the fastener shaft may be smooth, so as not to snag on through holes formed through the PCB 24 and/or the spacer 38.

In order to securely mount the high speed signal connector assembly 10 to the bottom surface 18 of the server board, the fasteners 44 are aligned with reciprocal openings formed through the PCB 24 and the spacer 38. Fastener throughholes 46 are shown on the spacer 38. Distal, threaded ends 48 of the fasteners 44 are then aligned and positioned within threaded securing openings or holes formed through the bottom surface 18 of the server board 12. The fasteners 44 are then engaged in the threaded securing openings to securely connect the high speed signal connector assembly 10 to the bottom surface 18 of the server board 12. When connected, the electrical contacts 30 mate with reciprocal contacts located on contact pads on the bottom surface 18 of the server board. In the connected position, at least portions of the PCB 24 and the spacer 38 are sandwiched between the bottom surface 18 of the server board 12 and the support plate 42.

In operation, high speed signals may pass between the CPU mounted on the server board 12, through the contact pads formed on the bottom surface 18, and into the electrical contacts 30 positioned on the PCB 24. The high speed signals may then pass between the electrical contacts 30 and the cables 32 and into the cable receptacle connector 34, which may connect to another electrical component. Accordingly, the high speed signal connector assembly 10 provides a signal path between the server board 12 and another electrical/network component, such as another server board, another CPU on the server board 12, or the like.

While the connector assembly 10 is shown with the support plate 42, the connector assembly 10 may alternatively not include the support plate 42. Instead, the PCB 24 may be formed of a sufficiently rigid material such that the fasteners 44 may simply pass through the PCB 24 and the spacer 38 and into the server board 12.

Also, alternatively, the connector assembly 10 may not include the spacer 38. Instead, the top surface 26 of the PCB 24 may directly interface with the bottom surface 18 of the server board 12. In such an embodiment, the electrical contacts 30 may be robust and resilient in order to safely and effectively contact the reciprocal contacts secured on the bottom surface 18 of the server board 12. For example, the electrical contacts 30 may be positioned within a socket housing, while the reciprocal contacts positioned on the bottom surface 18 of the server board 12 may be retained within a plug that mates with the socket housing. Alternatively, either the electrical contacts 30 or the reciprocal contacts positioned on the bottom surface 18 of the server board 12 may be solder balls that connect to respective signal traces.

Figure 2:
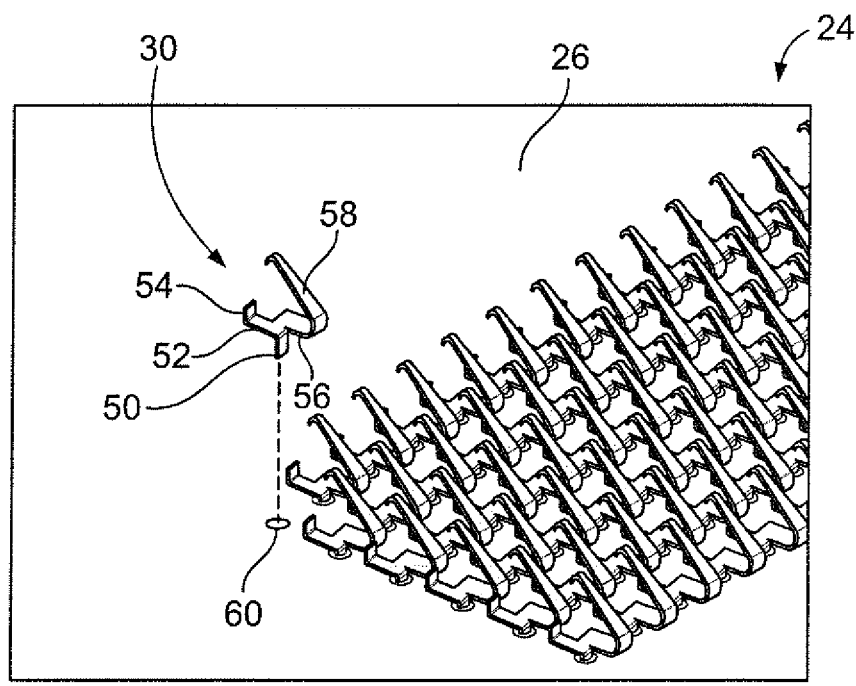
FIG. 2 illustrates a perspective top view of electrical contacts positioned on a printed circuit board, according to an embodiment of the present disclosure.

FIG. 2 illustrates a perspective top view of electrical contacts 30 positioned on the PCB 24, according to an embodiment of the present disclosure. For the sake of clarity, the spacer 38 is not shown in FIG. 2.

Each electrical contact 30 may be formed of a conductive material, such as a metal, and may include a board-engaging stem 50 that integrally connects to an intermediate beam 52 having an upturned tip 54. The intermediate beam 52 may also connect to an offset beam 56 that, in turn, connects to an upwardly canted contact beam 58. The stem 50 is configured to be retained within a plated through hole or via 60 formed in the PCB 24.

It is to be understood that the electrical contacts 30 shown in FIG. 2 are examples of electrical contacts that may be used with embodiments of the present disclosure. Various other electrical contacts may be used. For example, eye-of-the-needle contacts, pin and socket contacts, solder balls, and the like may be used with embodiments of the present disclosure.

Figure 3:
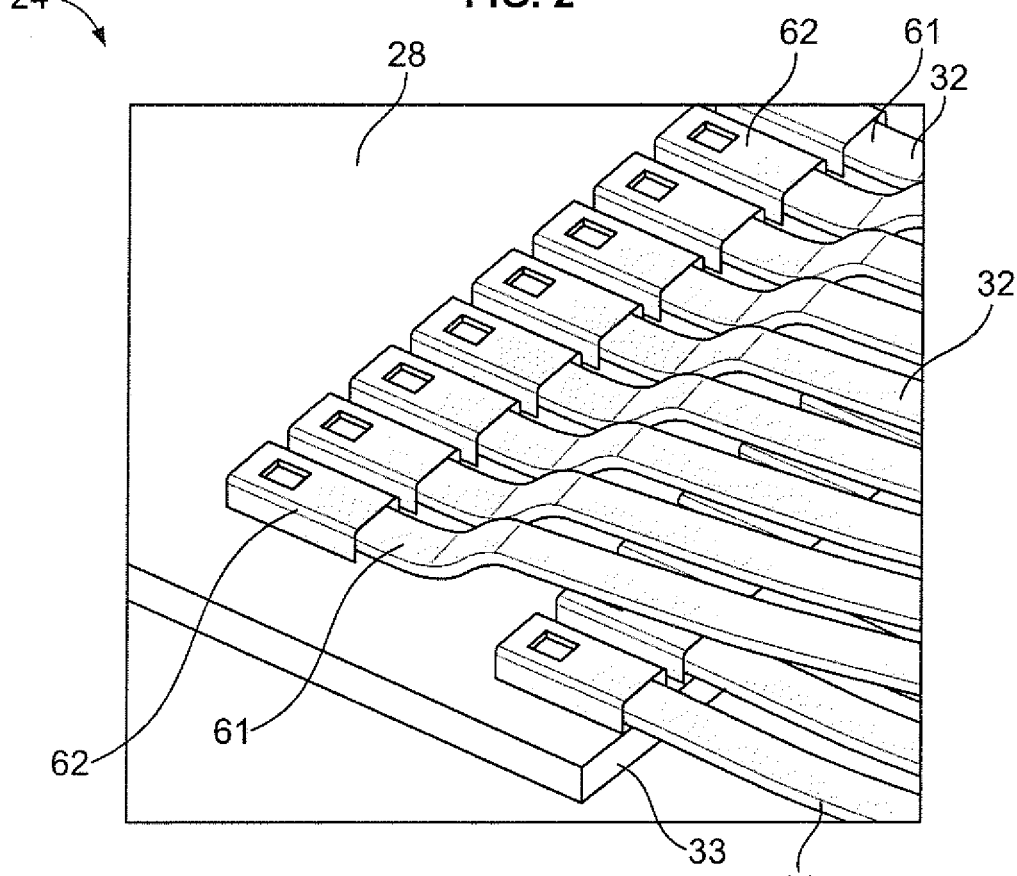
FIG. 3 illustrates a perspective bottom view of a front edge of a printed circuit board, according to an embodiment of the present disclosure.

FIG. 3 illustrates a perspective bottom view of the front edge 33 of the PCB 24, according to an embodiment of the present disclosure. Shields 62 surround exposed terminal ends 61 of the cables 32. The terminal ends 61 may be soldered to pads on the PCB 24. The shields 62 are connected to an electrical ground in the PCB 24 to provide electromagnetic shielding for the exposed terminal ends 61.

Referring again to FIG. 1, alternatively, the connector assembly 10 may include various other signal interfaces instead of cables. For example, the electrical contacts 30 on the PCB 24 may electrically connect to backplane connectors or jumpers positioned on the PCB 24.

Figure 4:
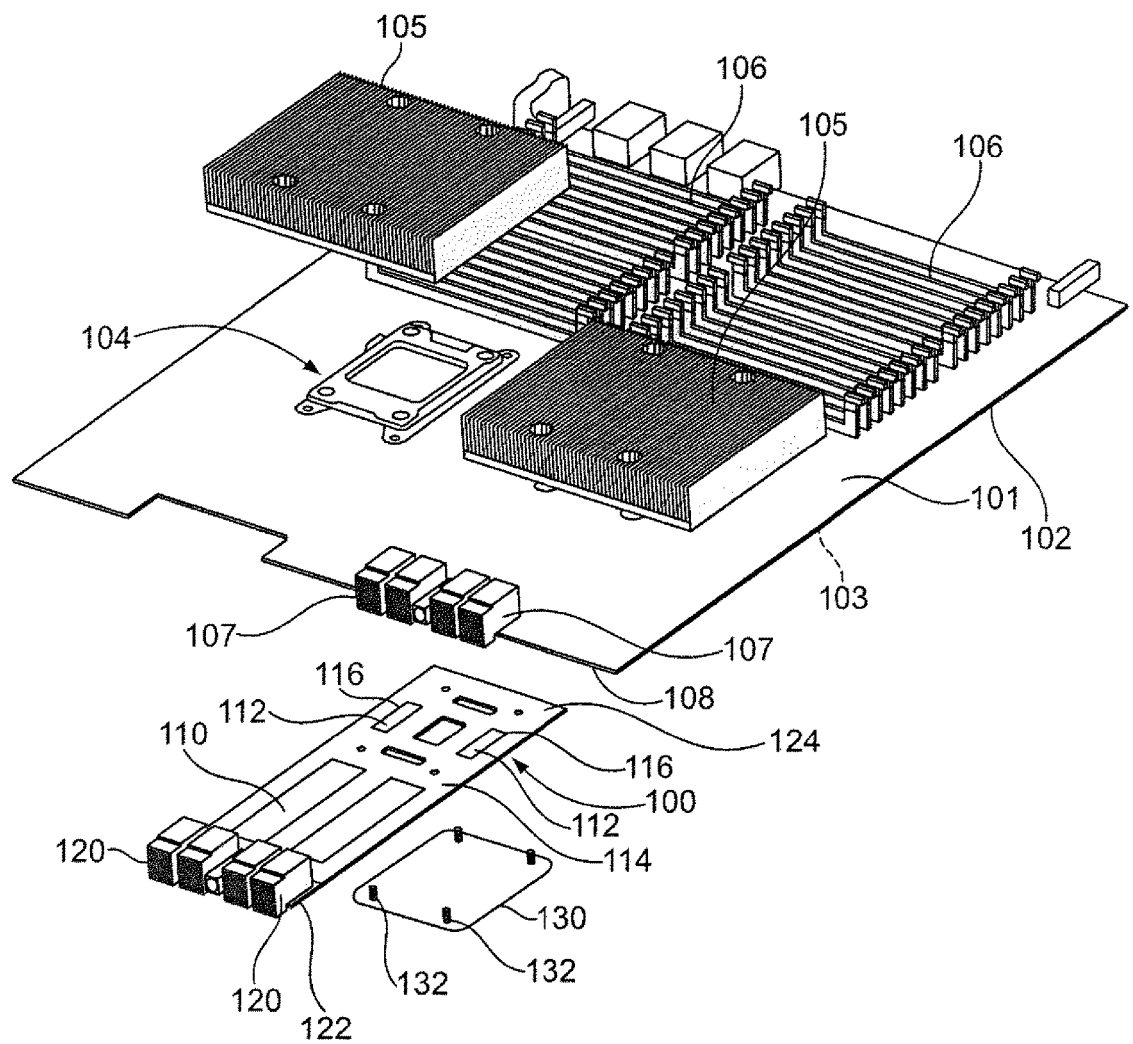
FIG. 4 illustrates a perspective top view of a high speed signal connector assembly aligned with a server board, according to an embodiment of the present disclosure.

FIG. 4 illustrates a perspective top view of a high speed signal connector assembly 100 aligned with a server board 102, according to an embodiment of the present disclosure. The server board 102 may include a top surface 101 and a bottom surface 103. The top surface 101 may support one or more CPUs 104 covered by heat sinks 105. The server board 102 may also support a plurality of board slot connectors 106, such as Dual Inline Memory Module Sockets (DIMM Sockets) that are configured to retain Dual Inline Memory Modules (DIMMs) (not shown). Backplane connectors 107 may be mounted to the server board 102 proximate to a front edge 108.

The high speed signal connector assembly 100 may include a PCB 110 that supports a plurality of electrical contacts 112, such as any of those described above. A spacer 114 may be positioned over the PCB 110 and may include openings 116 that expose the electrical contacts 112. The PCB 110 and the spacer 114 may be similar to those described above.

The connector assembly 100 may also include backplane connectors 120 positioned at or proximate to an end 122 that is opposite from an end 124 at which the electrical contacts 112 are located. The electrical contacts 112 may connect to the backplane connectors 120 through signal traces (not shown) in the PCB 110, for example.

The connector assembly 100 may also include a support plate 130 that retains a plurality of fasteners 132. The support plate 130 is used to assist in securely mounting the connector assembly 100 to the bottom surface 103 of the server board 102.

The backplane connectors 120 may connect to another server board (not shown). Thus, in the embodiment shown in FIG. 4, the connector assembly 100 may connect to the bottom surface 103 of the server board 102, and the backplane connectors 120 may connect to a riser (not shown in FIG. 1) that may connect to another server board. Optionally, the backplane connectors 120 may directly connect to another server board.

Alternatively, the connector assembly 100 may not include the backplane connectors 120. Instead, the connector assembly 100 may include electrical contacts at or proximate to the end 122 that are configured to mate with electrical contacts or backplane connectors of another server board.

Also, alternatively, the electrical contacts 112 may mate with electrical contacts secured to the bottom surface 103 of the server board. For example, the electrical contacts 112 may be directly underneath a CPU 104, or connected to the CPU through traces.

Figure 5:
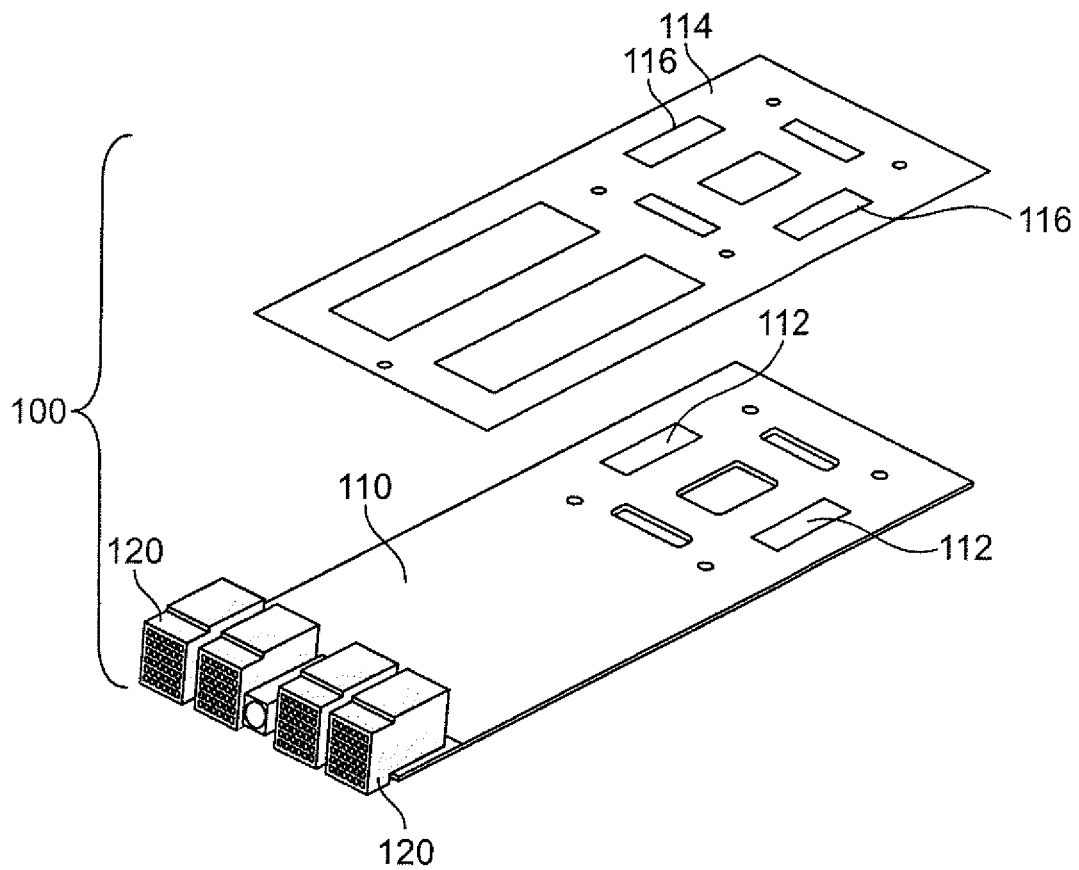
FIG. 5 illustrates a perspective, partially exploded view of a high speed signal connector assembly, according to an embodiment of the present disclosure.
Figure 6:
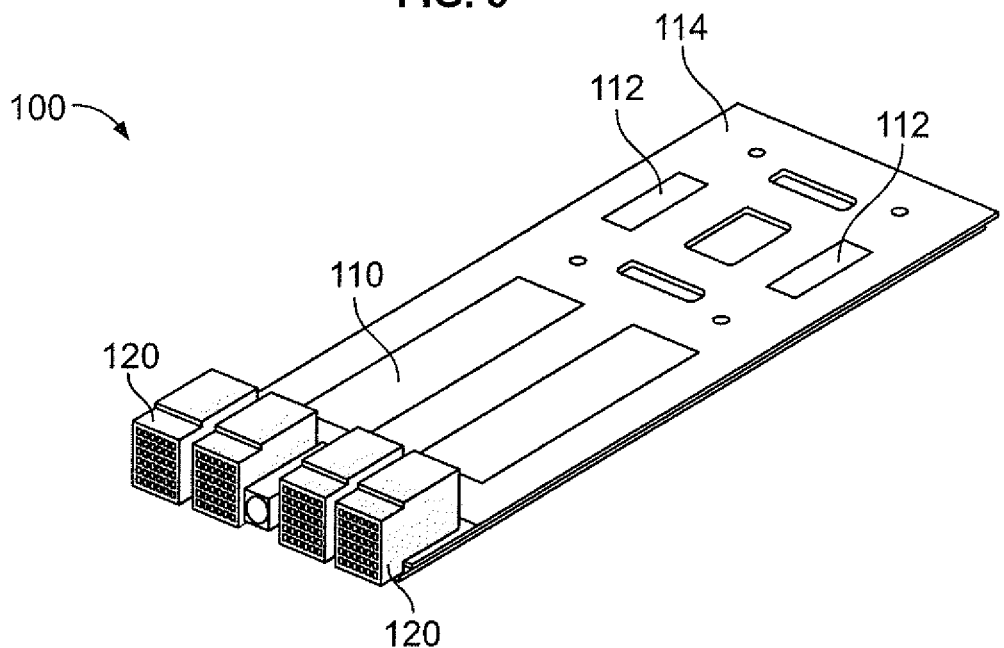
FIG. 6 illustrates a perspective top view of a high speed signal connector assembly, according to an embodiment of the present disclosure.

FIG. 5 illustrates a perspective, partially exploded view of the high speed signal connector assembly 100, according to an embodiment of the present disclosure. FIG. 6 illustrates a perspective top view of the high speed signal connector assembly 100. The support plate 130 is not shown in FIGS. 5 and 6. The PCB 110 may include more or less electrical contacts 112 at various locations other than shown. As noted above, the spacer 114 may be formed of plastic, and is configured to space the PCB 110 from the bottom surface 103 of the server board 102 (shown in FIG. 4) to protect the electrical contacts 112 and other components mounted to the PCB 110 from damage (such as may be caused through over-compression).

As noted, the electrical contacts 112 may connect to the backplane connectors 120 through signal traces (not shown). Alternatively, the connector assembly 100 may not include the backplane connectors 120, but may instead include additional electrical contacts that are configured to mate with reciprocal contacts on an underside of another server board, for example.

Figure 7:
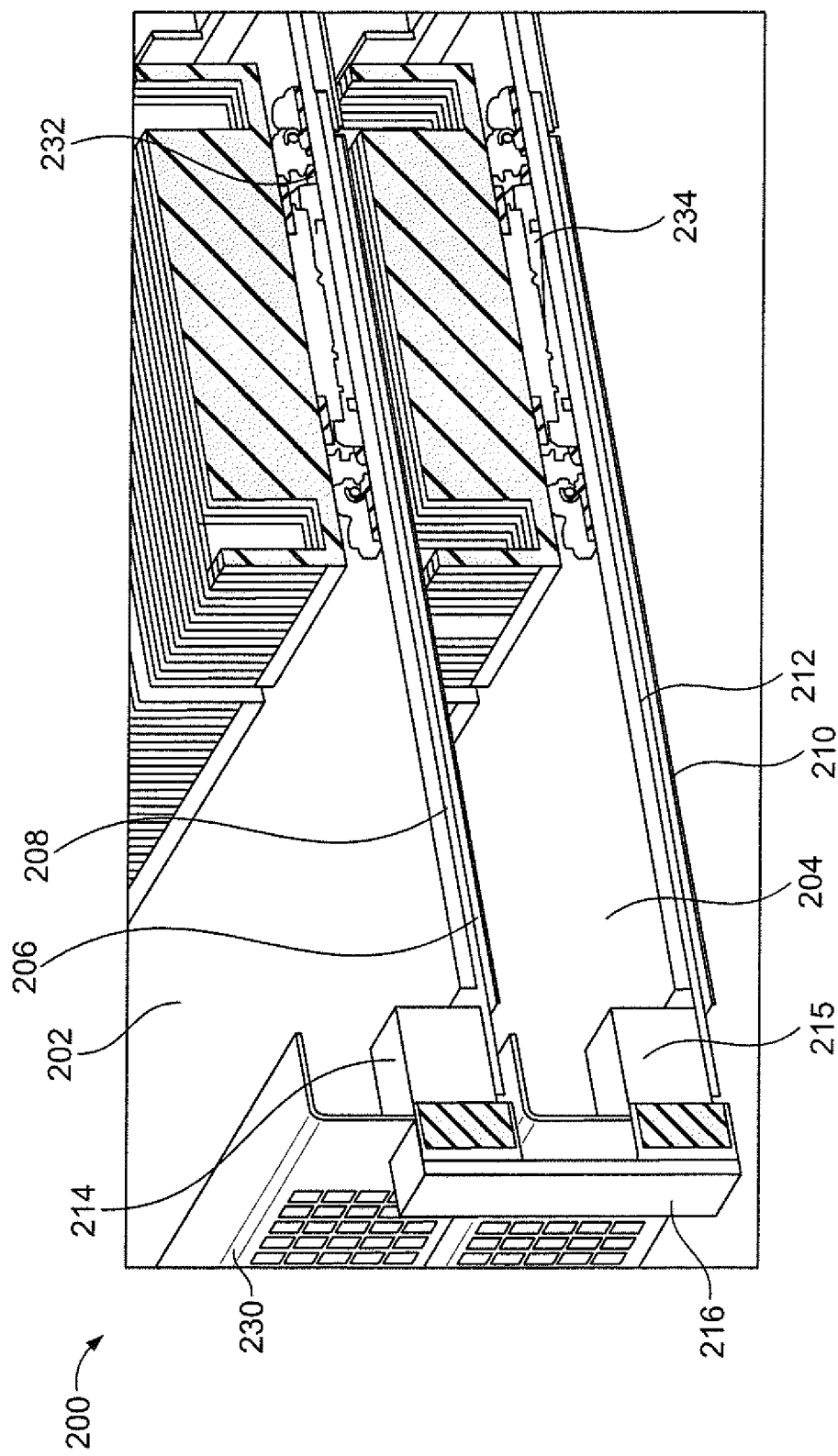
FIG. 7 illustrates a perspective lateral view of a system, according to an embodiment of the present disclosure.

FIG. 7 illustrates a perspective lateral view of a system 200, according to an embodiment of the present disclosure. The system 200 may include first and second server boards 202 and 204, respectively. As shown, a high speed signal connector assembly 206 is mounted to a bottom surface 208 of the first server board 202, while a high speed signal connector assembly 210 is mounted to a bottom surface 212 of the second server board 204. The connector assemblies 206 and 210 may be similar to any of those described above. For example, the connector assemblies 206 and 210 may each include backplane connectors 214 and 215, respectively, which connect to connectors on a riser 216. Further, electrical contacts at opposite ends from the backplane connectors 214 and 215 of each connector assembly 206 and 210, respectively, may mate with reciprocal electrical contacts formed on the bottom surfaces 208 and 212, respectively, of the server boards 202 and 204.

As shown in FIG. 7, the server board 202 may be mounted directly above the server board 204 and supported by a frame 230. Electrical signals, such as high speed data signals, may be transferred between CPUs 232 and 234 on the respective server boards 202 and 204 through the connector assemblies 206 and 210 mounted to the bottom surfaces 208 and 212, respectively. For example, an electrical signal may pass from the CPU 232 into the connector assembly 206 (such as through a contact interface between the server board 202 and the connector assembly 206), into the backplane connector 214. The electrical signal may then pass from the backplane connector 214 into the riser 216. The electrical signal then passes through the riser 216 and into the connector assembly 210 by way of the backplane connector 215. The electrical signal may then pass from the connector assembly 210 and into the CPU 234. Electrical signals may pass from the CPU 234 to the CPU 232 in a reverse manner.

Embodiments of the present disclosure may be used with various systems, other than shown. A system may include a first component device, such as a first CPU on a first server board, and a second component device, such as a second CPU on the first server board or a second server board. Connector assemblies, such as any of those described above, may be used to connect the first component device to the second component device. The connector assemblies provide separate and distinct assemblies that may mount to bottom surfaces (or surfaces that are opposite from those that directly support mounted components, such as a CPU) of a device, such as a server board or blade. Each connector assembly may connect to another component device or another connector assembly through a backplane connector, a daughtercard, one or more cables, or the like.

Referring to FIGS. 1-7, embodiments of the present disclosure provide a connector assembly that is configured to provide a high speed, high performance data path between two or more electrical/network devices (such as multiple server boards, multiple components on a single server board, a server board and a remote electrical device through cables, and/or the like). The connector assembly may be separate and distinct from each of the electrical/network devices. For example, the connector assembly may be a separate and distinct assembly that secures to a bottom surface of at least one server board.

Embodiments of the present disclosure provide a separate and distinct connector assembly that may be secured to a bottom surface of a system or server board or blade. In multi-card systems, right angle connectors, such as backplane connectors, may also be used. Further, a riser may be used to connect server boards in a vertical orientation.

Embodiments of the present disclosure may provide systems and methods for connecting server boards, for example, to one another. The server boards may be formed of standard materials, instead of more expensive specialized materials. The connector assemblies may be used with respect to any server board. Existing server boards may be retrofit with the separate and distinct connector assemblies to provide communication between components on different server boards or the same server board, for example.

Embodiments of the present disclosure provide connector assemblies that are configured to provide a high performance signal path that may connect to a bottom surface of a high performance electrical device, such as a server board.

While various spatial terms, such as upper, bottom, lower, mid, lateral, horizontal, vertical, and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the disclosure without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112(f), unless and until such claim limitations expressly use the phrase "means for" followed by a statement of function void of further structure.

What is claimed is:

1. A connector assembly configured to provide one or more signal paths between electrical components mounted on at least one component device, the connector assembly comprising:

a printed circuit board (PCB) that supports one or more contacts on a first PCB surface that is opposite from a second PCB surface, wherein the one or more contacts include: (a) a board-engaging stem connected to an intermediate beam, wherein the board-engaging stem is configured to be retained within a via formed within the PCB, (b) an upturned tip connected to the intermediate beam, (c) an offset beam extending from the intermediate beam, and (d) a canted contact beam extending from the offset beam;

a spacer secured over the first PCB surface, wherein at least portions of the one or more contacts are exposed through the spacer; and a support plate secured to the second PCB surface, wherein the support plate is configured to support the connector assembly with respect to a first device surface that is opposite from a second device surface on which at least one electrical component is mounted.

2. The connector assembly of claim 1, wherein the connector assembly is separate and distinct from the component device.

3. The connector assembly of claim 1, wherein at least a portion of the PCB and at least a portion of the spacer are configured to be sandwiched between the support plate and the first device surface.

4. The connector assembly of claim 1, further comprising at least one electrical cable extending from the PCB, wherein the at least one electrical cable connects to the one or more contacts.

5. The connector assembly of claim 4, wherein the at least one electrical cable connects to a cable receptacle connector.

6. The connector assembly of claim 1, further comprising one or more backplane connectors mounted on the first PCB surface, wherein the one or more backplane connectors connect to the one or more contacts.

7. A system comprising:
   a first component device having a first device surface and a second device surface that is opposite from the first device surface, wherein at least one electrical component is mounted on the first device surface, and wherein one or more first device contacts extend from the second device surface and connect to the at least one electrical component; and
   a connector assembly comprising:
      a printed circuit board (PCB) that supports one or more first connector contacts on a first PCB surface that is opposite from a second PCB surface, wherein the one or more connector contacts include: (a) a board-engaging stem connected to an intermediate beam, wherein the board-engaging stem is configured to be retained within a via formed within the PCB, (b) an upturned tip connected to the intermediate beam, (c) an offset beam extending from the intermediate beam, and (d) a canted contact beam extending from the offset beam;
      a spacer secured over the first PCB surface, wherein at least portions of the one or more first connector contacts are exposed through the spacer; and
      a support plate secured to the second PCB surface, wherein the support plate supports the connector assembly with respect to the second device surface, and wherein the one or more first connector contacts mate with the one or more first device contacts.

8. The system of claim 7, wherein the first component device comprises a server board, and wherein the at least one electrical component comprises a first central processing unit (CPU).

9. The system of claim 8, wherein the at least one electrical component comprises a second CPU connected to one or more second device contacts extending from the second device surface, and wherein the connector assembly comprises one or more second connector contacts on the first PCB surface, and wherein the one or more second connector contacts mate with the one or more second device contacts.

10. The system of claim 7, further comprising a second component device, wherein the connector assembly connects the first component device to the second component device.

11. The system of claim 10, wherein the second component device is positioned over the first component device.

12. The system of claim 7, wherein the connector assembly is separate and distinct from the first component device.

13. The system of claim 7, wherein at least a portion of the PCB and at least a portion of the spacer are sandwiched between the support plate and the second device surface.

14. The system of claim 7, further comprising at least one electrical cable extending from the PCB, wherein the at least one electrical cable connects to the one or more first connector contacts.

15. The system of claim 14, wherein the at least one electrical cable also connects to a cable receptacle connector.

16. The system of claim 7, wherein the connector assembly further comprises one or more backplane connectors mounted on the first PCB surface, wherein the one or more backplane connectors connect to the one or more first connector contacts.

17. A connector assembly configured to provide one or more signal paths between electrical components mounted on at least one component device, the connector assembly comprising:
   a printed circuit board (PCB) that supports one or more contacts on a first PCB surface that is opposite from a second PCB surface, wherein the one or more contacts include: (a) a board-engaging stem connected to a first beam, wherein the board-engaging stem is configured to be retained within a via formed within the PCB, (b) an second beam extending from the first beam, and (c) a canted contact beam extending from the second beam;
   a spacer secured over the first PCB surface, wherein at least portions of the one or more contacts are exposed through the spacer; and
   a support plate secured to the second PCB surface, wherein the support plate is configured to support the connector assembly with respect to a first device surface that is opposite from a second device surface on which at least one electrical component is mounted.

18. The connector assembly of claim 17, wherein the one or more contacts further include a downturned tip connected to the canted contact beam.

19. The connector assembly of claim 17, wherein the board-engaging stem is an eye-of-the-needle board engaging stem.

20. The connector assembly of claim 17, wherein the first beam is an intermediate beam.

21. The connector assembly of claim 17, wherein the second beam is an offset beam.

22. The connector assembly of claim 17, wherein the one or more contacts further include an upturned tip connected to the first beam.

* * * * *